United States Patent [19]

Kimura et al.

[11] 4,348,592
[45] Sep. 7, 1982

[54] APPARATUS FOR READING PATTERNS

[75] Inventors: Seiichiro Kimura, Komae; Yuhei Iwasaki, Fujisawa; Yuji Kozaki, Yokohama, all of Japan

[73] Assignee: Nippon Seiko Kabushiki Kaisha, Tokyo, Japan

[21] Appl. No.: 131,833

[22] Filed: Mar. 19, 1980

[30] Foreign Application Priority Data

Jan. 31, 1980 [JP] Japan .................................. 55-9295

[51] Int. Cl.³ ............................................ G01N 21/86
[52] U.S. Cl. .................................... 250/560; 356/387
[58] Field of Search ............... 250/556, 560, 561, 567; 356/71, 379, 380, 384, 385, 386, 387

[56] References Cited

U.S. PATENT DOCUMENTS 3,947,130 3/1976 Procter ................................. 356/387
4,064,534 12/1977 Chen et al. ........................... 250/560
4,269,515 5/1981 Altman ................................. 356/387

Primary Examiner—David C. Nelms
Attorney, Agent, or Firm—Wyatt, Gerber, Shoup, Scobey & Badie

[57] ABSTRACT

The present invention is directed to improvements in an automatic pattern reading apparatus of the type which comprises a light source for illuminating an object pattern, an imaging unit for receiving the illumination light reflected by or transmitted through the object pattern and a drive unit for one- or two-dimensionally moving said object pattern or said imaging unit. The improvement comprises means for detecting the leading edge position of said object pattern by means of the output picture signal from said imaging unit, means for detecting the trailing edge position of said object pattern, area detection means for detecting an area including the area defined by the leading and trailing edge positions and the area surrounding said defined area and characteristic extract means for extracting the characteristic amount of said object pattern by means of picture signal derived from the detected area.

9 Claims, 13 Drawing Figures

APPARATUS FOR READING PATTERNS

BACKGROUND OF THE INVENTION

1. Field of the Invention

The present invention relates to apparatus for reading patterns and more particularly the present invention relates to an automatic pattern reading apparatus especially adaptable for making a tape used for a perforator controlled numerically to provide perforations in such items as a substrate of the type typically used for printed circuit boards for providing holes for mounting components or for through-holes.

2. Description of the Prior Art

At present, few patterns for printed circuits or the like are designed with the intention of locating the perforations used for mounting component parts or for through-holes by numerical techniques. In typical printed circuit patterns, the pattern is formed on a film sheet and manually read by using a perforation reading apparatus.

Since, as mentioned above, the conventional perforation reading apparatus is manually operated, the operator has to visually examine the perforations one by one through a magnifying glass or the like. To align the center of a perforation with the center of a cross mark provided on the magnifying glass, the operator has to move a table on which the pattern is laid or an optical system by hand operation. When alignment is obtained, the operator gives an instruction to a control apparatus such as a computer to read the coordinates and diameter of the perforation.

Such alignment work with the conventional apparatus often makes the operator easily fatigued which leads to errors by the operator in reading perforations or failure to read some perforations.

With the rapid advancement of printed circuit pattern techniques and miniaturization of mounting parts, the packaging density for the print of substrate tends to increase. For these reasons, it is acknowledged in the art that the manual operation system has already reached its limit in view of ability and mental aspects. The manual operation system mentioned above in which the operator aligns the center of a perforation with the center of a cross mark in the magnifying glass, involves another disadvantage. This system lacks the ability to read the diameter of the perforation. Therefore, it was, hitherto, required to previously affix colored marks to the patterns in a form of film sheet using different colors for different perforation diameters. This necessitates a work prior to the perforation reading and additional time for the previous work.

SUMMARY OF THE INVENTION

Accordingly, it is an object of the invention to eliminate the disadvantages involved in the pattern reading apparatus of the prior art mentioned above.

It is a more specific object of the invention to provide an automated pattern reading apparatus in which the pattern reading operation can be carried out automatically by using a simple pattern detection system.

The present invention is widely applicable for reading various patterns. When the present invention is embodied in a reading apparatus for printed patterns, it is characterized by the steps of scanning a pattern including a perforation with an image pick-up element or the like, detecting an area in which the perforation is present by noting the leading and trailing edge positions thereof by means of signals obtainable from said scanning, and computing the coordinates of the center and the diameter of the perforation. This embodiment will be described in detail later with reference to the accompanying drawings.

Other and further objects, features and advantages of the invenntion will appear more fully from the following description of embodiments with reference to the accompanying drawings.

DESCRIPTION OF THE PREFERRED EMBODIMENTS

Figure 1:
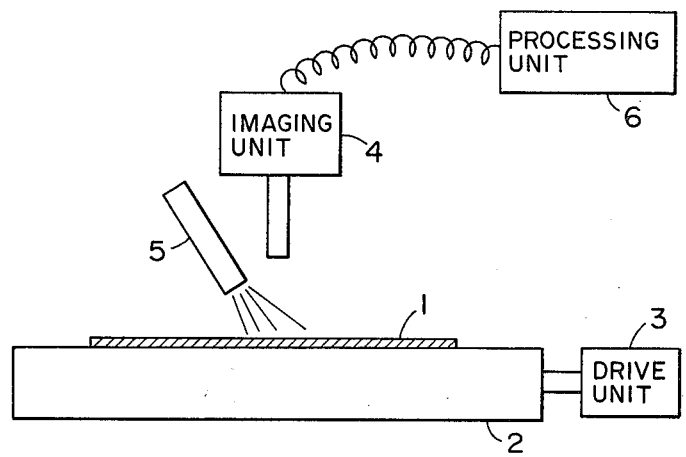
FIG. 1 is a schematic illustration of a pattern reading apparatus in accordance with the invention.
Figure 2:
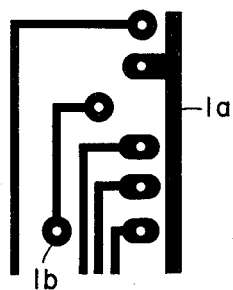
FIG. 2 shows an example of object pattern formed on a sheet.

In FIG. 1, a sheet 1 is placed on a movable table 2. The sheet 1 has an object pattern formed thereon and the table 2 is movable in either one or two directions. As illustrated in FIG. 2, the pattern on the film 1 may be composed of black pattern areas 1*a* and remaining transparent areas 1*b* including hole portions. The table is driven by a drive unit 3. When it is wished to drive the table 2 in two directions, two sets of such drive units 3 are provided in two directions at right angles to each other. Opposed to the sheet 1 is an imaging unit 4 suspended from above to optically read the object pattern on the sheet 1. The imaging unit 4 is comprised of a one-dimensional photo diode array, two-dimensional photo diode array or other photo-electric transducer element such as an image pick-up tube. In the optical part of the imaging unit there is provided a lens system which determines the magnification for reading the object pattern. Further, a light source unit 5 is provided to uniformly illuminate the visual field of the imaging unit 4. In the embodiment shown in FIG. 1, the light from the light source unit 5 is reflected by the object pattern and the reflected light is detected. However, this arrangement may be modified to detect light transmitted through the object pattern. Connected with the imaging unit 4 is a processing unit 6 for processing the photo-electric signals of the object pattern obtained by the imaging unit and determining the characteristics of the object pattern. This processing unit 6 constitutes the main part of the present invention and is comprised of functional circuits as shown in FIG. 3.

Figure 3:
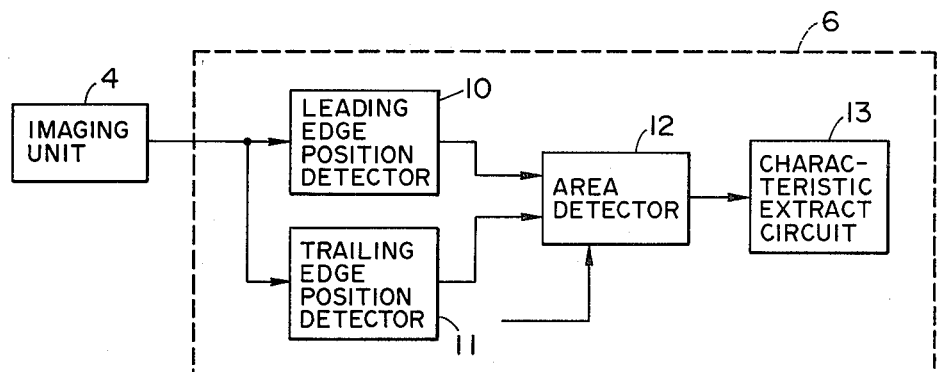
FIG. 3 is a block diagram of a processing unit which constitutes the main part of the present invention.

Referring to FIG. 3, the processing unit includes a leading edge position detector circuit 10 and a trailing edge position detector circuit 11. In the manner illustrated in FIG. 4, the object pattern is moved horizontally passed the image unit 4 in the direction of the arrows, and is moved vertically in increments. Consequently, the leading edge position detector 10 detects the leading edge position of the object pattern at the point Ⓐ . In the same manner, the trailing edge position detector 11 detects the trailing edge position at the point Ⓑ in FIG. 4. Details of the detectors 10 and 11 are shown in FIG. 5.

Figure 5:
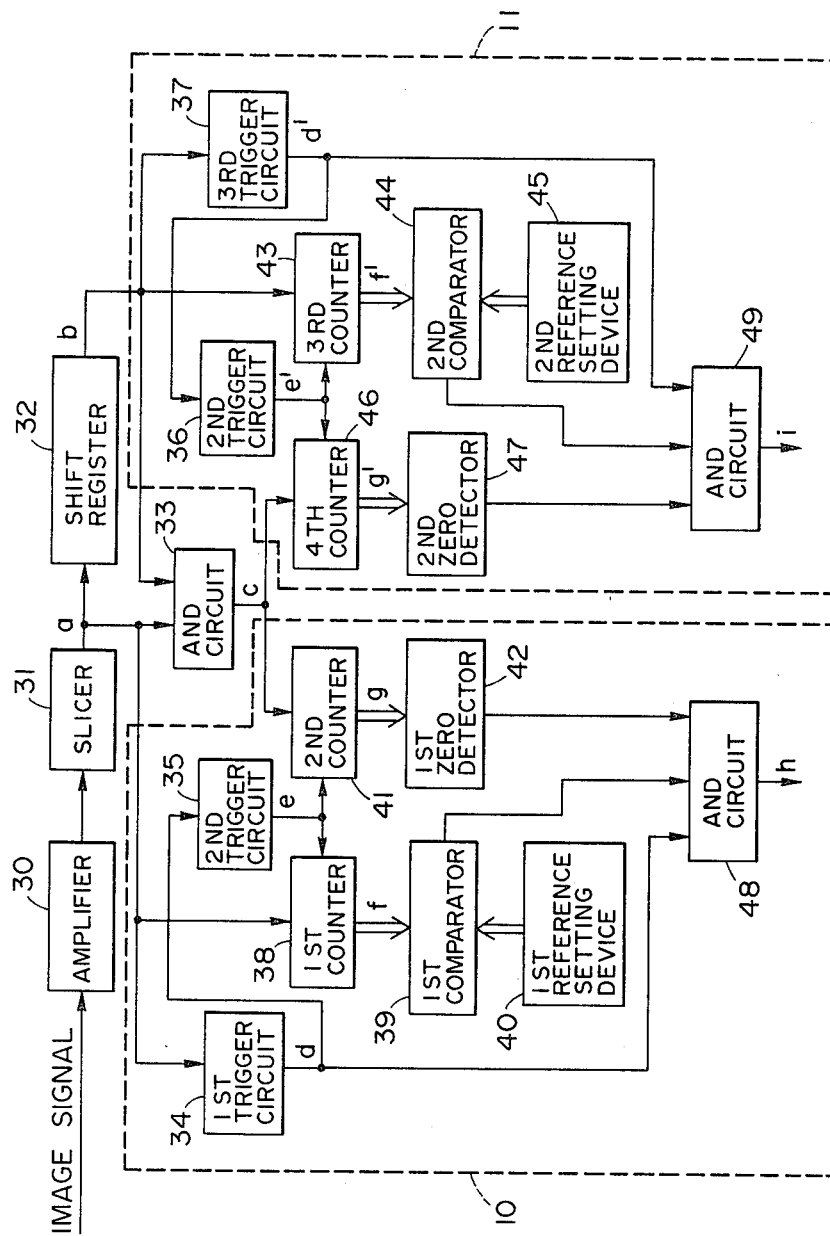
FIG. 5 is a block diagram of a circuit for detecting the leading and trailing edge positions.
Figures 6A, 6B:
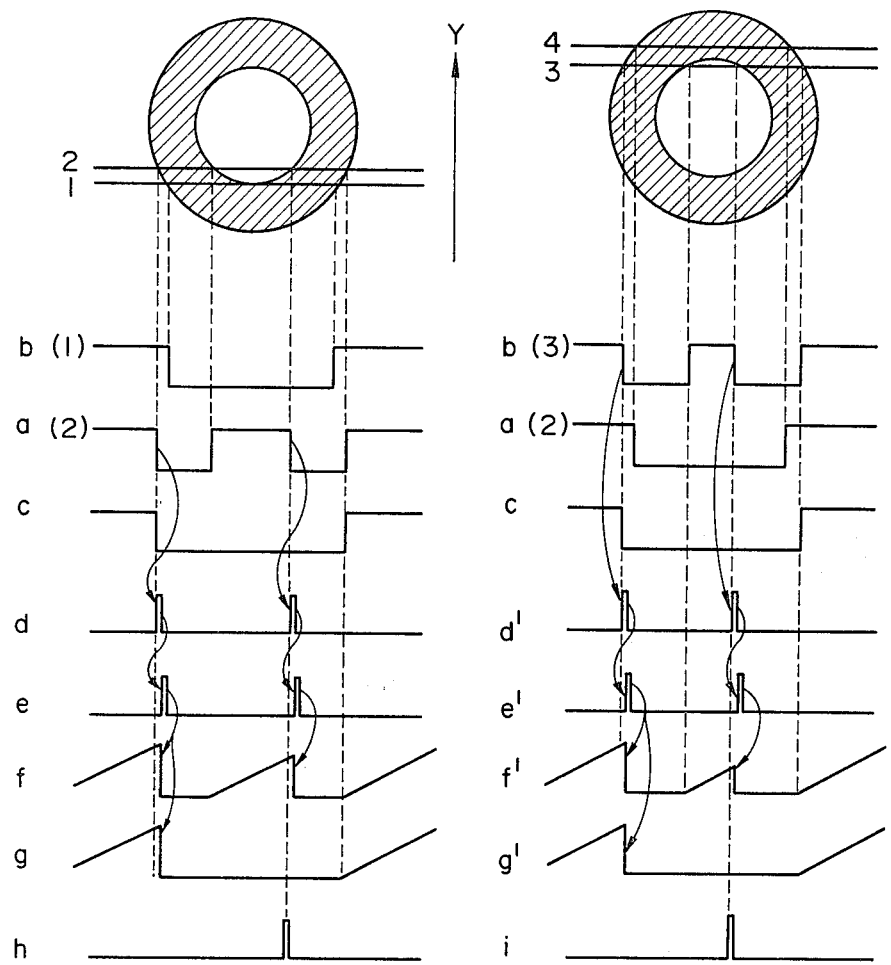
FIGS. 6A and 6B show the wave forms appearing at respective parts of the circuit shown in FIG. 5, in connection with the perforation pattern shown in FIG. 4.

FIG. 5 shows one form of means for detecting the leading and trailing edge positions of an object pattern in the automatic pattern reading apparatus according to the invention, and FIGS. 6A and 6B show time charts thereof for explaining the embodiment.

In the arrangement shown in FIG. 5, the output from the imaging unit 4 is amplified up to a determined level by an amplifier 30 and then it is transformed into a digital signal by a slicer 31. The output signal from the slicer 31 is delayed by a shift resistor 32 for a time period corresponding to a predetermined integer multiple of the time for one horizontal scan, and the delayed output is then introduced into AND circuit 33 together with the next scanning signal ⓐ coming from the slicer 31. The signal ⓐ is "1" or logically high when a transparent or light area is being scanned, and, when high, enables a first counter 38 receiving a clock signal for the horizontal scanning. The first counter 38 provides a count signal corresponding to the width of the logically high signal from the slicer 31. A second counter 41 provides a count signal corresponding to the width of the logically high or "1" output signal ⓒ of the AND circuit 33. The contents of these first and second counters are read by an output signal ⓓ from a first trigger circuit 34 which signal ⓓ is produced by the fall of the signal ⓐ . As will be described later in connection with FIG. 7, the content of the first counter 38 is compared with a reference value set by a first reference setting device 40 in a first comparator 39 to eliminate any possible detection error. The output ⓖ of the second counter 41 is put into a first zero detector 42 to detect zero. At the end of a first trigger signal there is issued from a second trigger circuit 35 an output ⓔ which clears the first and second counters 38 and 41.

Figure 7:
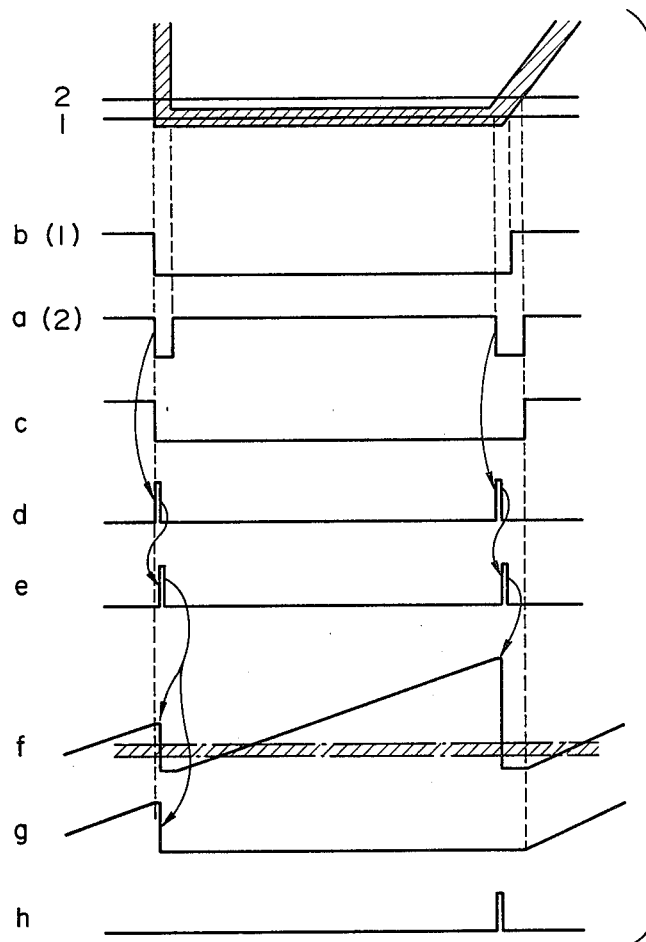
FIG. 7 shows the wave forms appearing in the circuit shown in FIG. 5 when an object pattern including no perforations is detected.

As will be understood from FIG. 6A, the leading edge position of a hole of the object pattern is detected only when the transparent area corresponding to the hole portion is scanned by a horizontal scanning after a continuous black pattern area has been scanned by the previous horizontal scanning. In other words, with reference to FIG. 5, a detection signal informing of the leading edge position of the hole is obtainable from the second AND circuit 48 only when the output ⓕ of the first counter 38 containing the content of the now proceeding horizontal scanning is below the determined reference value and the signal of the second counter 41 containing the content of the previous horizontal scanning is zero. As shown in FIG. 7, there may be a possibility that an output signal is also issued from the second AND circuit 48 even when a transparent part other than the hole belonging to the object pattern is scanned. However, no trouble may be brought about therefrom when the value set by the first reference setting device 40 has been predetermined taking into account the diameter of the hole and the scanning speed in the vertical direction.

The trailing edge position of the object pattern is detected in the following manner:

The output signal ⓑ of the shift register 32 is introduced into a third counter 43 together with a clock signal for the horizontal scanning and the third counter develops a count signal corresponding to the width of the logically high signal from the shift register. A fourth counter 46, like the above second counter 41, developes a signal corresponding to the width of the logically high signal ⓒ of the first AND circuit 33. The contents of the third and fourth counters are read when an output signal ⓓ' is produced from a third trigger circuit 37, which is issued upon the fall of the signal ⓑ . In a second comparator 44 the content of the third counter 43 is compared with a reference value set by a second reference setting device 45. The output ⓖ' of the fourth counter 46 is introduced into a second zero detector 47 to detect zero. At the end of output signal ⓓ' of the third trigger circuit, a fourth trigger circuit 36 issues an output signal ⓔ' which clears the third and fourth counters 43 and 46.

As will be understood from FIG. 6B, the trailing edge position of the object pattern is detected only when the dark pattern area is scanned by a horizontal scanning after the transparent hole part has been scanned by the previous horizontal scanning. In other words with reference to FIG. 5, a signal informing of the detection of the trailing edge position of the hole is obtainable from the third AND circuit 49 only when the output singal ⓕ' of the third counter 43 containing the content of the previous horizontal scanning is above the determined value and the signal of the fourth counter 46 containing the content of the now proceeding horizontal scanning is zero.

As shown in FIG. 3, the outputs from the leading and trailing edge position detectors 10 and 11 are given to an area detector 12. Details of the area detector 12 are shown in FIG. 8.

Figure 8:
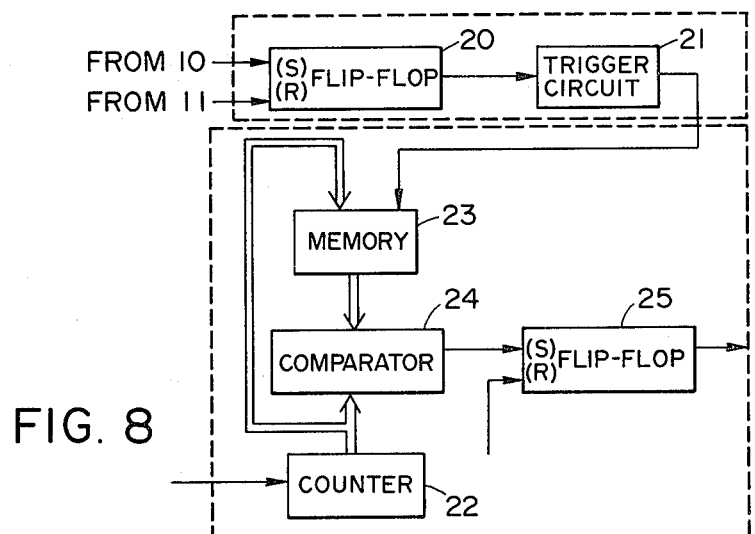
FIG. 8 is a block diagram of a circuit for detecting the area of an object pattern.

In FIG. 8, a flip-flop designated by 20 is set by the output from the leading edge position detector 10 and reset by the output from the trailing edge position detector 11. The output from the flip-flop 20 determines the area of the object pattern measured in the vertical direction.

Figure 4:
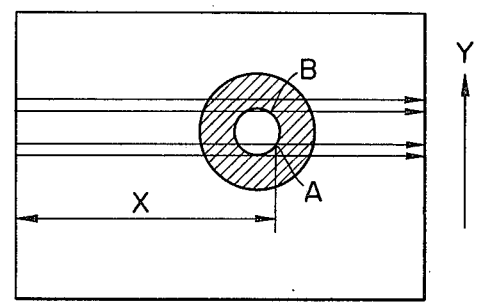
FIG. 4 illustrates the manner of detecting the leading and trailing edge positions of a perforation pattern.

A counter 22 serves to count the clock signals for the horizontal scanning. The counter 22 is reset at the time when it has just counted a certain number of clock signals which is determined by the imaging unit 4 and its resolution. By this reset of the counter, one horizontal scanning within the imaging unit 4 is terminated and the next horizontal scanning is started. When the leading edge position of the object pattern is detected at the point Ⓐ in FIG. 4, the output of the flip-flop 20 becomes "1". At the same time, the output of the counter 22 appearing at that time is stored in a memory 23 by means of a trigger pulse signal from the trigger circuit 21. Namely, a count value corresponding to the coordinate X in the horizontal scanning direction of the leading edge position Ⓐ of the object pattern shown in FIG. 4 is stored in the memory 23. In a comparator 24, the coordinate of the leading edge position in the horizontal direction and the output from the counter 22 are compared to each other to detect that at every horizontal scanning subsequent to the detection of the leading edge position, scanning has been made up to the position equal to the coordinate X of the leading edge position Ⓐ in horizontal direction.

Another flip-flop designated by 25 is set by the output from the comparator 24 and reset by the rise of the picture signal. The flip-flop 25 serves to determine the trailing edge of the hole of the object pattern in the horizontal direction. Thus, the area of the hole of the object pattern is determined in the horizontal direction as well as in the vertical direction by the area detector 12. By means of the signal derived from the area detector and using a characteristic extract circuit 13 there is now obtained the characteristic amount of the object pattern, that is, the coordinate of the center and the size of the area.

Figure 9:
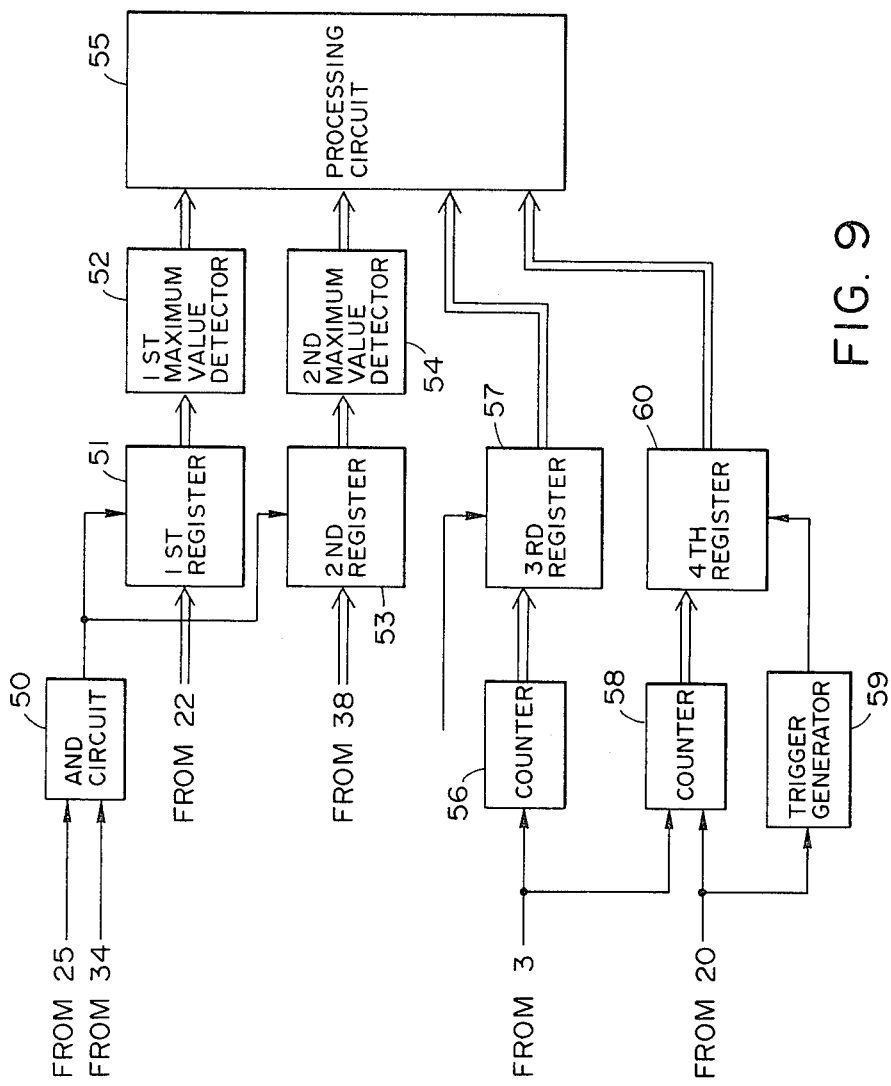
FIG. 9 is a block diagram of a characteristic extract circuit.

FIG. 9 shows an embodiment of such characteristic extract circuit useful for a automatic pattern reading apparatus in accordance with the invention.

Figure 10:
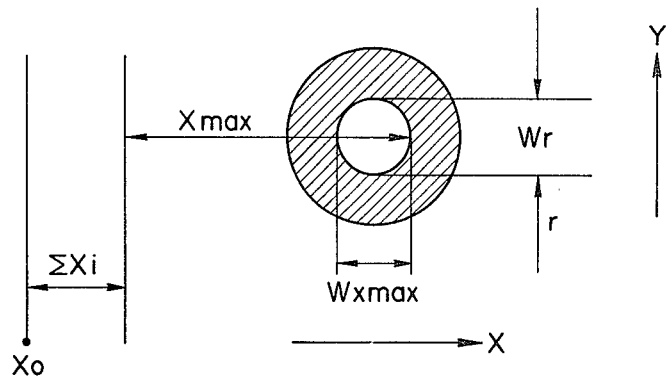
FIG. 10 illustrates the step of detecting the coordinates of the center of an object pattern and the size of the same by the circuit shown in FIG. 9.

At every scanning performed during the time from the detection of the leading edge position to the detection of the trailing edge position, AND circuit 50 makes a logical product of the output signal from the flip-flop 25 in FIG. 8 and the output signal ⓓ from the first trigger circuit in FIG. 5. Using the output signal of AND circuit 50 as clock, a first register 51 stores therein the output of the counter 22 shown in FIG. 8. The output of the register 51 is introduced into a first maximum value detector 52 which detects the maximum trailing edge position of the object pattern in the horizontal direction. Also, using the output of AND circuit 50 as a clock, a second register 53 stores therein the output from the first counter 38 in FIG. 5 so that information of the maximum width of the hole of the object pattern in the horizontal direction is given by a second maximum value detector 54. Information of the maximum trailing edge position (X max in FIG. 10) and that of the maximum width (Wx max in FIG. 10) thus obtained are introduced into a processing circuit 55 to obtain the coordinate of the center (Xc) of the hole of the object pattern the horizontal direction. Assuming that the moving table or the optical system is intermittently moved in the X-direction starting from the origin Xo and the amount of movement of the table or the optical system at i time intermittent movement is Xi, then the coordinate of the center of the hole of the object pattern in the horizontal direction after the i time intermittent movement in X-direction, that is, Xc will be given the following equation (1):

$$Xc = X\max - \tfrac{1}{2} Wx\max + \Sigma Xi \quad (1)$$

On the other hand, information of the object pattern in the vertical direction is introduced into the processing circuit 55 in the following way:

A counter 58 counts pulse inputs from the drive unit 3 for moving the table 2. The output from the counter is stored in a third register 57 using the output signal of the trigger circuit 21 as the clock signal and then it is introduced into the processing circuit 55. Another counter 58 counts the pulse inputs of the drive unit 3 only during the time the output signal of flip-flop 20 in FIG. 8 is "1". At the point in time when the output of flip-flop 20 changes from "1" to "0", a trigger generator 59 generates an output signal. Using this output signal as a clock signal, the output signal (Wy in FIG. 10) from the above counter 58 is stored in a fourth register 60 and then transferred to the processing circuit 55. Thereby the coordinate of center Yc of the hole of the object pattern in the vertical direction is obtained by the following equation (2):

$$Yc = Y + \tfrac{1}{2} Wy \quad (2)$$

Thus, the coordinates of the center and the size of the hole of the object pattern can be obtained.

Furthermore, an operation is carried out to know $|Wx\max - Wy|$ from the output Wx max of the second maximum value detector 54 in FIG. 9 and the output Wy of the counter 58.

$$|Wx\max - Wy| \leq a \quad (3)$$

wherein, a is a preset value.

The characteristic extract circuit may be formed to further include a circuit for giving a decision that the hole of the object pattern is a circle when the above condition formula (3) is satisfied.

Furthermore, it is possible to detect two or more object patterns at the same time in the horizontal scanning direction by providing two or more sets of the following components:

Flip-flop 20, trigger circuit 21, memory 23, comparator 24 and flip-flop 25 as shown in FIG. 8; and AND circuit 50, first register 51, first maximum value detector 52, second register 53, second maximum value detector 54, third register 57, counter 58, trigger generator 59 and fourth register 60 as shown in FIG. 9.

Figure 11:
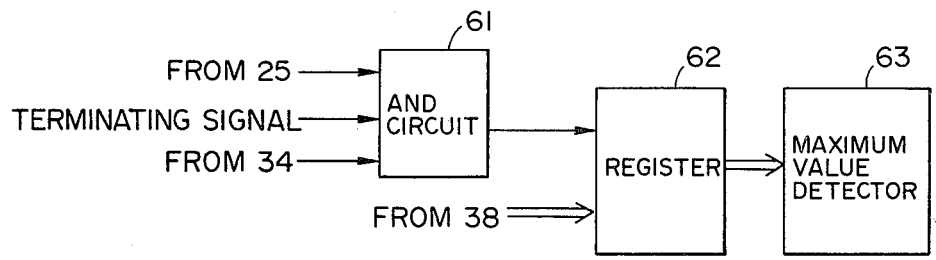
FIG. 11 is a block diagram of a circuit for detecting the amount of overlap between the successive effective vidual fields of an imaging unit.

FIG. 11 shows one form of means for determining the amount of overlap of effective visual fields of the imaging unit in the automatic pattern reading apparatus according to the invention.

In most cases wherein the whole surface of a print pattern is to be scanned by automatic reading apparatus in order to read the coordinates of the center of an object hole as well as the diameter of the same hole, the size of a film sheet having the print pattern formed thereon is larger than the size of the effective visual field of the imaging unit. Therefore, it is usually required to additionally carry out a mechanical scanning in addition to the electrical scanning performed by the image pickup elements. When the mechanical scanning is carried out intermittently, it is essential to keep the object pattern completely contained within the effective visual field of the imaging unit during scanning. Namely, it is required that the visual field for one mechanical scanning and that for the next mechanical scanning be partially overlapped. In scanning according to the prior art, the amount of overlap has been generally fixed to a particular value which was determined considering the size of an object pattern. However, the size of the object pattern is not constant but varies from one to another. Since, hitherto, the amount of overlap was uniformly determined depending upon the largest object pattern, the effective visual field of imaging unit practically useful for scanning had to be made narrow. This brought forth the disadvantage that a relatively long time is required to scan the whole surface of a film sheet having a print pattern formed thereon. According to the preferred embodiment of the invention, the amount of overlap between effective visual fields is not a fixed value but is variably determined so that the time required to read the patterns can be substantially shortened as compared with that in the prior art.

Figure 12:
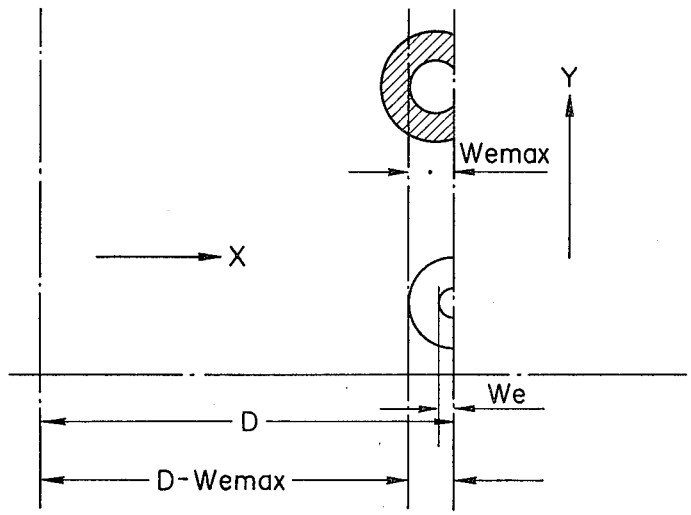
FIG. 12 illustrates the manner how to detect the amount of overlap using the circuit shown in FIG. 11.

In FIG. 11, AND circuit 61 makes a logical product of the output signal from flip-flop 25 in FIG. 8, the horizontal scan terminating signal and the output signal from the first trigger circuit 34 in FIG. 5. Using the signal thus obtained as a clock signal the output signal from the counter 38 in FIG. 5 is stored in a register 62. The maximum value of the content in the register 62 is detected by a maximum value detector 63. Thus, the maximum value detector 63 stores the maximum value of values of patterns detected at the end of scanning in the horizontal direction (in X-direction). The maximum value is shown in FIG. 12 as We max which is the largest one of detected values We. In FIG. 12, D is the length of effective visual field of the imaging unit 4 as measured in the horizontal scanning direction (X). By the processing circuit 55 shown in FIG. 9, D-We max is computed and depending upon the result the amount of intermittent movement of the table 2 in the horizontal direction is set. By setting the amount in this manner there is assured a most effective scanning and therefore the time required to read the patterns can be shortened substantially.

As will be understood from the foregoing, the present invention enables the detection of the coordinates and diameters of perforations in a pattern such as printed pattern through pattern detection using a simplified arrangement of circuits. According to the invention it is made possible to save labour necessary for making tapes used for numerical control perforator. Moreover, accuracy and speed in the detection of the perforations can be improved to a great extent in accordance with the invention.

What we claim is:

1. In an automatic apparatus for reading object portions of a pattern, said object portions having a light reflective characteristic different from other portions of the pattern, said apparatus having a light source for uniformly illuminating said pattern, an imaging unit for receiving light from said pattern to produce an image signal when receiving light from said object portion, and drive means for moving said pattern relative to said imaging unit to scan said pattern in successive increments, the improvement comprising means responsive to said image signals for producing a leading-edge signal upon first encountering said object portion after a previous scan not encountering said object portion, means responsive to said image signals for producing a trailing edge signal upon last encountering said object pattern, area detection means for detecting the area of said object pattern scanned between producing said leading edge signal and said trailing edge signal determining a selected characteristic of said object portion.

2. An automatic pattern reading apparatus as set forth in claim 1, wherein said apparatus further comprises a circuit for pre-processing said image signal from said imaging unit to produce a logical signal, said means for producing said leading edge signal comprises a first counter for producing a first count signal indicating the duration of said image signal, a second counter for producing a second count signal indicating the duration of said logical signal, a first timing signal means forming a first timing signal at the end of said image signal for reading the outputs from said first and second counters, a second timing signal means forming a second timing signal at the end of said first timing signal for resetting the outputs of said first and second counters, and a first AND circuit for producing said leading edge signal when the output of said first counter is below a predetermined value and the output of said second counter is zero.

3. An automatic pattern reading apparatus as set forth in claim 1, wherein said apparatus further comprises a circuit for pre-processing said image signal from said imaging unit to produce a logical signal, said means for producing said trailing-edge signal comprises a third counter for producing a third count signal indicating the duration of said delayed image signal, a fourth counter for producing a fourth count signal indicating the duration of said logical signal, a third timing signal means forming a timing signal at the end of said delayed image signal for reading the outputs of said third and fourth counters, a fourth timing signal means for forming a a fourth timing signal at the end of said third timing signal for resetting the outputs of said third and fourth counters, and a second AND circuit for producing said trailing edge signal when the output of said third counter is above a predetermined value and the output of said fourth counter is zero.

4. An automatic pattern reading apparatus as set forth in claim 1, wherein said area detection means comprises a memory for storing said leading edge signal during a scanning in a first direction, means including a comparator for comparing signals corresponding to succeeding scans in said first direction with the output of said memory to define an area and a flip-flop circuit set by the leading edge signal and reset by the trailing edge signal.

5. An automatic pattern reading apparatus as set forth in claim 4, wherein at least two of said area detection means are provided so as to enable the detection of a corresponding number of object portions at the same time in the same visual field.

6. An automatic pattern reading apparatus as set forth in claim 1, wherein said characteristic extract means comprises a maximum value detector for detecting the maximum width of said object portion in a first scanning direction by detecting the maximum value of outputs from said first counter and for determining the size of said object portion in a second scanning direction by counting the amount of relative movement.

7. An automatic pattern reading apparatus as set forth in claim 6, wherein said characteristic extract means comprises further a comparing and determining circuit for determining whether said object portion is a specified pattern by comparing said maximum value of said output from said first counter with the size thereof in the second direction and detecting whether said two values are substantially equal to each other.

8. In an automatic apparatus for reading object portions of a pattern, said object portions having a light reflective characteristic different from other portions of the pattern, said apparatus having a light source for uniformly illuminating said pattern, an imaging unit for receiving light from said pattern and drive means moving said pattern relative to said imaging unit to scan said pattern in successive increments, the improvement comprising means for receiving said image signals for producing a leading edge signal upon first encountering said object portion after a previous scan not encountering said object portion, means for receiving said image signals for producing a trailing edge signal upon last encountering said object pattern, area detection means for selecting the area of said object pattern scanned between producing said leading edge signal and trailing edge signal, characteristic extract means for determining a selected characteristic of said object portion, and overlap detection means for detecting the amount of overlap between an effective visual field and the next effective visual field of said imaging unit formed when said imaging unit is intermittently driven relative said pattern.

9. An automatic pattern reading apparatus as set forth in claim 8, wherein said overlap detection means comprises means for detecting the maximum width We max of said object portion in a first scanning direction at the terminal position of the scanning in said first direction by means of image signals obtained when said object portion is moved in a second direction relative said imaging unit while electrically scanning the pattern with an effective width D of said imaging unit, operations means for conducting the operation of D−We max and instruction means for instructing said drive unit to move said pattern relative said imaging unit in an amount of intermittent movement based upon the result of said operation.

* * * * *